United States Patent
Lackey et al.

(10) Patent No.: US 10,877,612 B2
(45) Date of Patent: Dec. 29, 2020

(54) CAPACITIVE TOUCH/PROXIMITY SENSOR WITH INTEGRATED ULTRA-HIGH FREQUENCY ANTENNA

(71) Applicant: CONTINENTAL AUTOMOTIVE SYSTEMS, INC., Auburn Hills, MI (US)

(72) Inventors: John Lackey, Rochester, MI (US); Maxime Micheau, Auburn Hills, MI (US); Olivier Gérardière, Tournefeuille (FR)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 16/273,197

(22) Filed: Feb. 12, 2019

(65) Prior Publication Data

US 2019/0250737 A1 Aug. 15, 2019

Related U.S. Application Data

(60) Provisional application No. 62/630,455, filed on Feb. 14, 2018.

(51) Int. Cl.
| | |
|---|---|
| *G06F 3/044* | (2006.01) |
| *E05B 81/78* | (2014.01) |
| *H05K 1/02* | (2006.01) |
| *E05B 81/76* | (2014.01) |
| *H03K 17/955* | (2006.01) |

(Continued)

(52) U.S. Cl.
CPC .............. *G06F 3/044* (2013.01); *E05B 81/77* (2013.01); *E05B 81/78* (2013.01); *H01Q 1/3241* (2013.01); *H01Q 1/3283* (2013.01); *H01Q 1/48* (2013.01); *H01Q 1/521* (2013.01); *H03K 17/955* (2013.01); *H03K 17/962* (2013.01); *H05K 1/0243* (2013.01); *G06F 2203/04101* (2013.01); *H03K 2017/9602* (2013.01);

(Continued)

(58) Field of Classification Search
CPC ...................................................... G06F 3/044
See application file for complete search history.

(56) References Cited

U.S. PATENT DOCUMENTS

| | | | | |
|---|---|---|---|---|
| 2002/0167448 A1* | 11/2002 | Kushihi | ............... | H05K 1/0293 343/700 MS |
| 2006/0085160 A1* | 4/2006 | Ouchi | ................ | G01N 21/3581 702/150 |

(Continued)

FOREIGN PATENT DOCUMENTS

| | | |
|---|---|---|
| DE | 102016102667 A1 | 8/2017 |
| EP | 2276109 A1 | 1/2011 |

(Continued)

OTHER PUBLICATIONS

International Search Report and Written Opinion dated May 31, 2019 from corresponding International Patent Application No. PCT/US2019/017766.

*Primary Examiner* — Sejoon Ahn

(57) ABSTRACT

A device includes a capacitive touch sensor having a copper trace defining a capacitive electrode. The copper trace has a saw-tooth configuration. An ultra-high frequency (UHF) antenna is provided. A metal ground plane integrates the capacitive touch sensor with the UHF antenna. The saw-tooth copper trace aids in reducing interference with the UHF antenna.

16 Claims, 4 Drawing Sheets

(51) Int. Cl.
*H01Q 1/52* (2006.01)
*H01Q 1/32* (2006.01)
*H01Q 1/48* (2006.01)
*H03K 17/96* (2006.01)

(52) U.S. Cl.
CPC ............. *H03K 2217/96078* (2013.01); *H03K 2217/960705* (2013.01); *H03K 2217/960765* (2013.01)

(56) References Cited

U.S. PATENT DOCUMENTS

| | | | | |
|---|---|---|---|---|
| 2007/0164868 A1* | 7/2007 | Deavours | ............. | H01Q 9/0442 340/572.7 |
| 2007/0208235 A1* | 9/2007 | Besson | ................ | A61B 5/6826 600/301 |
| 2009/0273529 A1* | 11/2009 | Liu | ........................ | H01Q 1/243 343/725 |
| 2010/0244656 A1* | 9/2010 | Ito | ........................ | H01Q 1/2283 313/358 |
| 2011/0156972 A1* | 6/2011 | Korva | ................... | H01Q 1/273 343/745 |
| 2012/0214412 A1* | 8/2012 | Schlub | ................. | G01B 7/023 455/41.1 |
| 2013/0135161 A1* | 5/2013 | Fujimoto | ............. | H01Q 1/3233 343/725 |
| 2015/0028864 A1 | 1/2015 | Wang et al. | | |
| 2015/0171916 A1* | 6/2015 | Asrani | ................ | H04M 1/0202 455/575.7 |
| 2016/0342257 A1* | 11/2016 | Watazu | ................... | G01L 1/146 |
| 2017/0220158 A1* | 8/2017 | Peng | ..................... | G06F 3/0412 |
| 2017/0331474 A1* | 11/2017 | Jiao | ...................... | B60R 19/483 |
| 2019/0081385 A1* | 3/2019 | Avser | ..................... | H01Q 1/243 |
| 2019/0081386 A1* | 3/2019 | Edwards | .................. | H01Q 1/48 |

FOREIGN PATENT DOCUMENTS

| | | |
|---|---|---|
| GB | 2471161 A | 12/2010 |
| WO | 2013/091961 A1 | 6/2013 |

\* cited by examiner

CAPACITIVE TOUCH/PROXIMITY SENSOR WITH INTEGRATED ULTRA-HIGH FREQUENCY ANTENNA

This application is based on and claims priority from U.S. Provisional Application No. 62/630,455, filed on Feb. 14, 2018, the contents of which is hereby incorporated by reference into this specification.

FIELD

The invention relates to a capacitive touch and proximity sensor for a vehicle and, more particularly, to capacitive touch and proximity sensor integrated with a radio wave, ultra-high frequency antenna in a manner so as to avoid interference with the antenna.

BACKGROUND

Vehicle door handles are being equipped with device having capacitive touch and proximity sensors for detecting approach and/or contact of a user. The detection of approach and/or contact of a user, coupled with the recognition of a "hands-free" electronic fob or of a smartphone for remote access control carried thereby, allows the remote locking and unlocking of the doors of the vehicle. Thus, when the user, carrying the electronic fob or the corresponding smartphone identified by the vehicle, moves their hand near the inner pocket of the door handle of his vehicle, the doors of the vehicle are automatically unlocked. Conversely, when the user, still carrying the necessary fob identified by the vehicle, wishes to lock his vehicle, he closes the door of his vehicle and he presses momentarily on another precise location of the handle, called the "locking zone". This movement makes it possible to lock the openable panels of the vehicle automatically.

The conventional touch sensor typically comprises two capacitive sensors, in the form of two electrodes linked electrically to a printed circuit and integrated into the door handle, each in a precise locking or unlocking zone. Generally, one electrode is dedicated to each zone, that is to say one electrode is dedicated to detecting the approach and/or contact of the user's hand in the locking zone and one electrode is dedicated to detecting the approach and/or contact of the user's hand in the unlocking zone.

The conventional device furthermore comprises a communication device in the form of a radio frequency antenna, in order to exchange an identifier between the vehicle and the hands-free access fob or the telephone. This antenna can be of the Low Frequency (LF) type, for example at 125 kHz.

In the case where the portable device is a portable user apparatus such as a mobile telephone or a tablet, or a laptop computer, Radio Frequency and LF communication with the vehicle is not always possible, since most mobile telephones (or tablets, or laptop computer . . . ) do not possess any RF, or LF, means of communications whose frequencies are compatible with those used during communication with a vehicle, such as the frequencies of 315 MHz and 433.92 MHz for RF and 125 kHz for LF.

However, these portable user apparatuses now employ the Bluetooth® or Bluetooth Low Energy "BLE" communication standard, that is to say communication at ultra-high frequency (UHF) from 2.4 GHz to 2.48 GHz. This communication standard exhibits the advantage of being universal and therefore does not require any accreditation specific to each country (only a Bluetooth Low Energy international certification), as is the case with the current RF and LF communications standards whose operating frequency differs according to country.

It therefore becomes necessary to adapt the "hands-free" access and/or starting system to a vehicle so that it can also operate with a portable user apparatus equipped with the Bluetooth® communication standard and no longer solely by way of radio waves and low-frequency waves (RF, LF). The advantage of the Bluetooth® communication standard or of Bluetooth Low Energy BLE is that it allows a large communication range of up to 10 m, around the vehicle for BLE. Bluetooth® communication therefore exhibits numerous advantages with respect to low frequency. Thus, the newer devices include a UHF antenna.

The conventional device is typically connected to the vehicle's electronic control unit (ECU) and the device sends to the ECU, a presence detection signal. The ECU of the vehicle has, beforehand, identified the user as being authorized to access this vehicle, or alternatively, subsequent to the reception of this presence detection signal, it undertakes this identification, carried out by the communication device operating at UHF. As explained previously, when the "hands-free" access device is a portable user apparatus, the exchange of identifier takes place by Bluetooth® communication. If the ECU recognizes the identification code as the one authorizing access to the vehicle, it triggers the locking/unlocking of the door (or of all the openable panels). If, on the other hand, the electronic computer has not received any identification code or if the identification code received is erroneous, locking or unlocking does not take place.

With the conventional device, it has been found that such integration of the capacitive touch sensor with a UHF antenna causes interference to occur that leaves the UHF antenna unable to communicate. In situations where choice of location for capacitive sensors and antennae is restricted (as in a vehicle door handle), such interference is even more pronounced.

Thus, there is a need to provide a device having a capacitive touch sensor integrated with a UHF antenna configured to lessen interference with the UHF antenna.

SUMMARY

An objective of the invention is to fulfill the need referred to above. In accordance with the principles of the present invention, this objective is obtained by providing a device that includes a capacitive touch/proximity sensor having a copper trace defining a capacitive electrode. The copper trace has a saw-tooth configuration. An ultra-high frequency (UHF) antenna is provided. A metal ground plane integrates the capacitive touch/proximity sensor with the UHF antenna. The saw-tooth copper trace aids in reducing interference with the UHF antenna.

In accordance with another aspect of an embodiment, a device includes a capacitive touch/proximity sensor having a copper trace defining a capacitive electrode. The copper trace has a saw-tooth configuration and each segment of the copper trace has a width of at least 1 mm. An ultra-high frequency (UHF) antenna is provided. A metal ground plane integrates the capacitive touch/proximity sensor with the UHF antenna. Surfaces of the ground plane define a first material empty area around the UHF antenna, with the first material empty area being in the range of about 240 $mm^2$ to 280 $mm^2$. Other surfaces of the ground plane define second and third material empty areas, each immediately adjacent to a side of the electrode that faces the UHF antenna. The saw-tooth copper trace and the material empty areas in the ground plane aid in reducing interference with the UHF antenna.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENTS

Figure 1:
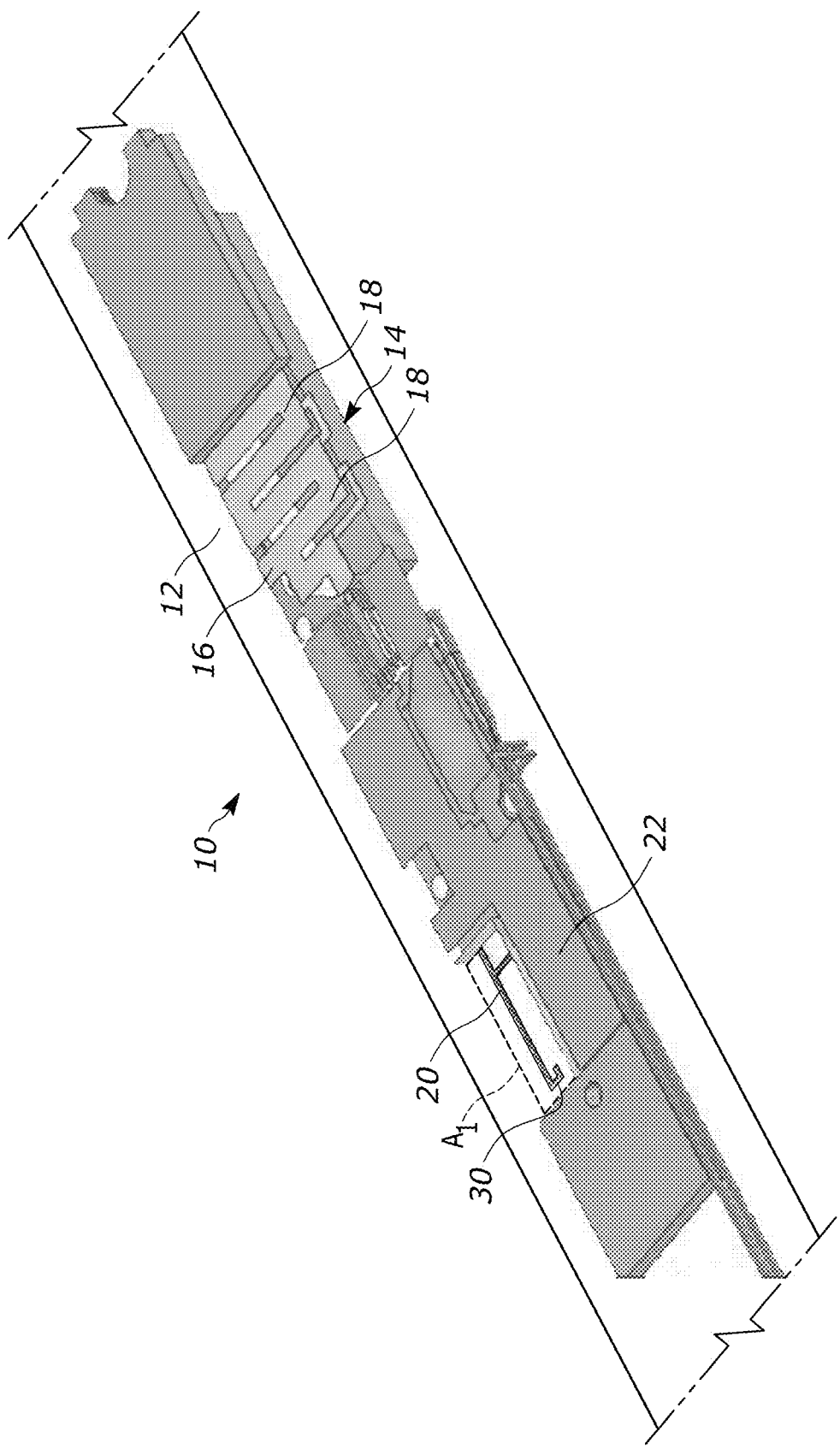
FIG. 1 is a perspective plan view of a device for detecting locking/unlocking of a door having capacitive touch/proximity sensor integrated with a UHF antenna in accordance with a first embodiment.

FIG. 1 shows a device 10 for detecting locking/unlocking of a door in accordance with an embodiment. The device 10 is implemented in a vehicle door handle 12. The device 10 includes capacitive touch/proximity sensor shown generally at 14 integrated with a UHF antenna 20. FIG. 1 shows the conductive, metal electrode 16 that is dedicated to detecting the approach and/or contact of the user's hand in the locking zone. The other electrode that is dedicated to detecting the approach and/or contact of the user's hand in the unlocking zone is not shown. The electrode 16 comprises metal traces 18 in the form of a square wave that includes 90° angles.

The device 10 can include a managing unit (not shown) for managing the emission and reception of the data at the UHF by way to the antenna 20. The antenna 20 and sensor 14 are integrated via a copper or metal ground plane 22.

Figure 2:
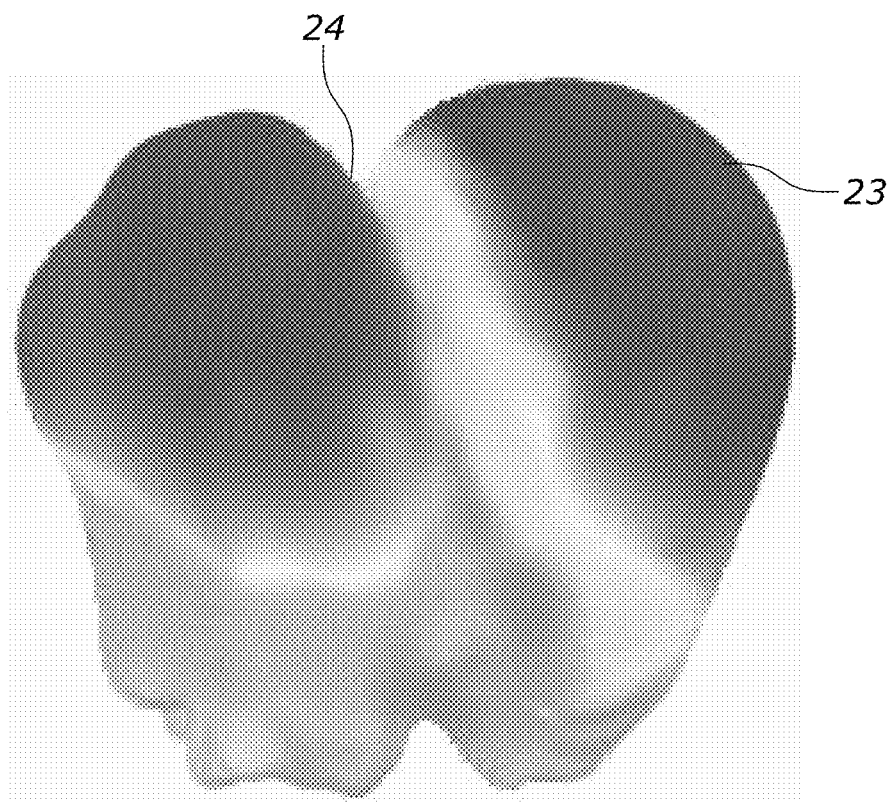
FIG. 2 is a radiation plot of the UHF antenna of FIG. 1.

In the device 10, the position of the UHF antenna and the position of the capacitive electrode are each fixed, and are about ¼ wavelength apart. However, this arrangement has been found to causes interference and thus could cause communication failure of the UHF antenna 20. FIG. 2 shows a plot of an electromagnetic radiation pattern 23 of the UHF antenna 20 having an interference or dead zone 24 in the middle thereof. As a result, a user's smartphone may not connect with the device 10 and the door will not unlock.

Figure 3:
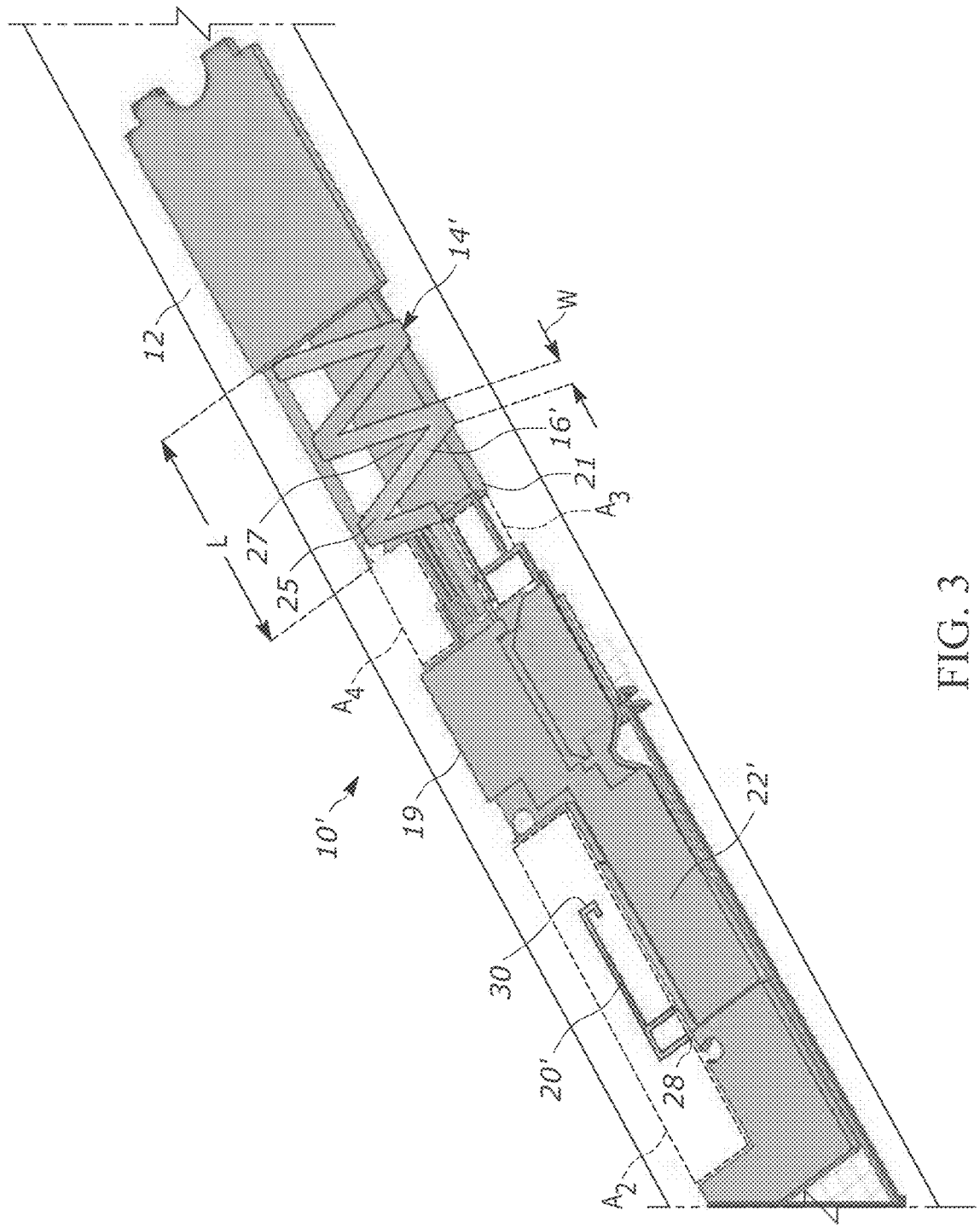
FIG. 3 is a perspective plan view of a device for detecting locking/unlocking of a door having a capacitive touch/proximity sensor integrated with a UHF antenna in accordance with a second embodiment.

With reference to FIG. 3, a device for detecting human touch and/or proximity is shown, generally indicated at 10', in accordance with another embodiment that reduces or eliminates the interference zone 24 resulting from the device 10 of FIG. 1.

The device 10' is preferably mounted in a door handle 12 of a vehicle, but can be employed in other applications. The device 10' includes a capacitive touch/proximity sensor, generally indicated at 14' and a Bluetooth® or a radio wave UHF antenna 20' integral with the capacitive sensor 14' via a an electrically conductive metal ground plane 22'. The ground plane 22' is preferably copper. The ground plane 22' is typically mounted on a printed circuit board (not shown).

As in FIG. 1, the UHF antenna 20' and the capacitive touch sensor 14' of FIG. 3 are generally spaced ¼ wavelength apart. In the embodiment of FIG. 3, to reduce or eliminate interference between the sensor 14' and UHF antenna 20', the copper trace or electrode 16' that is electrically connected with a control unit (not shown) is of saw-tooth configuration having a plurality of alternating peaks 25 and valleys 27. In the embodiment, the saw-tooth configuration is substantially of "W" shape. The each segment of the copper trace 16' has a width W of at least 1 mm and preferably of at least 3 mm. The overall length L of the trace 16' is at least 22 mm. In addition, since the trace 16' is of triangular form, 90° angles present in conventional copper trace 16 have been eliminated, which also reduces interference with the UHF antenna 20'.

To further reduce interference, the ground plane 22' has been modified to remove material. In particular, comparing FIG. 1 to FIG. 2, material has been removed from surfaces of the ground plane 22' to define empty areas labeled as $A_2$, $A_3$ and $A_4$ in FIG. 3. In particular, copper material has been removed from the ground plane 22' immediately adjacent to a side of the electrode 16' that faces the UHF antenna to 20 (areas $A_3$ and $A_4$). Area $A_3$ defines a cut-out in side 19 of the ground plane 22' while area $A_4$ defines a cut-out in opposing side 21 of the ground plane 22'. In addition, copper material has been removed from the ground plane 22' adjacent to the UHF antenna 20' (area $A_2$). The area $A_2$ defines a rectangular cut-out in side 19 of the ground plane 22' and is in the range of about 240 mm$^2$ to 280 mm$^2$ and is preferably about 250 mm$^2$. For comparison, the material removed around the antenna 20 of FIG. 1 defines a material empty area $A_1$ that is about 160 mm$^2$. The UHF antenna 20' is disposed generally centrally with area $A_2$. Areas $A_3$ and $A_4$ are also generally rectangular and are each about 50 mm$^2$.

To even further reduce interference, as compared to FIG. 1, the UHF antenna 20' of the embodiment (FIG. 3) has been flipped in orientation. In particular, the UHF antenna 20' is cantilevered, with one end 28 fixed to the ground plane 22' and having a free end 30 facing toward the electrode 16' (instead of facing away from the electrode 16 in FIG. 1). Thus, free end 30 floats within empty area $A_2$.

Figure 4:
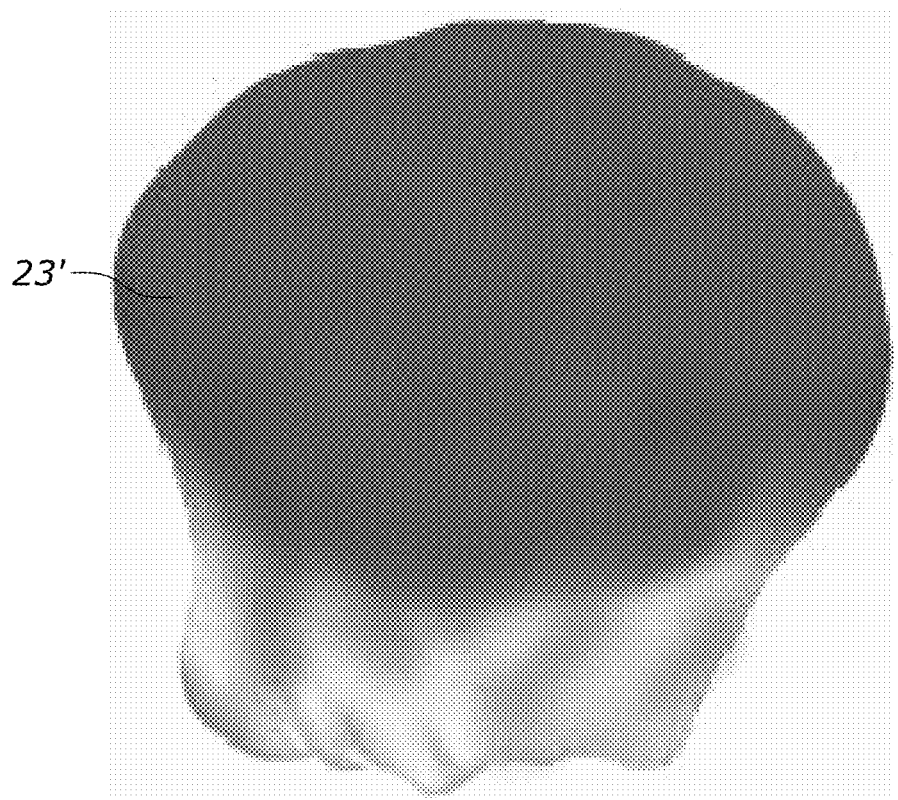
FIG. 4 is a radiation plot of the UHF antenna of FIG. 3.

Thus, the saw-tooth shape and surface area of the electrode 16', the reduction in material of copper ground plane 22', and the orientation of the UHF antenna 20' all contribute to reduce interfering communication with the UHF antenna 20', allowing the Bluetooth® communication to improve. FIG. 4 shows a plot of an electromagnetic radiation pattern 23' of the UHF antenna 20', which has a generally bulbous portion that is absent the interference zone 24 of FIG. 2.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:
1. A device comprising:
   a capacitive sensor having a copper trace defining a capacitive electrode, the copper trace having a saw-tooth configuration,
   an ultra-high frequency (UHF) antenna separate from and spaced from the capacitive sensor, and a metal ground plane integrating the capacitive sensor with the UHF antenna, wherein the UHF antenna is cantilevered, with one end fixed to the ground plane and having a free end facing towards the electrode, wherein surfaces of the ground plane define a cutout in a side of the ground plane thereby defining a first material empty area around the UHF antenna, with the free end of the UHF antenna floating within the first material empty area, the first material empty area being in the range of about 240 mm$^2$ to 280 mm$^2$, wherein other surfaces of the ground plane define second and third material empty areas, each immediately adjacent to a side of the electrode that faces the UHF antenna, wherein the second material empty area defines a cut-out in one side of the ground plane and the third material empty area defines a cut-out in an opposing side of the ground plane.

2. The device of claim 1, wherein each segment of the copper trace has a width of at least 1 mm.

3. The device of claim 1, wherein each segment of the copper trace has a width of at least 3 mm.

4. The device of claim 1, wherein an overall length of the copper trace is at least 22 mm.

5. The device of claim 1, wherein the saw-tooth configuration is substantially of "W" shape.

6. The device of claim 1, wherein the area of the first material empty area is generally rectangular and about 250 mm$^2$.

7. The device of claim 1, wherein each of the second and third material empty areas is generally rectangular and about 50 mm$^2$.

8. The device of claim 1, wherein the ground plane is copper.

9. The device of claim 1, wherein the UHF antenna and the electrode are spaced ¼ wavelength apart.

10. The device of claim 1, wherein the capacitive sensor and the UHF antenna are part of a door handle of a vehicle.

11. A device comprising:

a capacitive sensor having a copper trace defining a capacitive electrode, the copper trace having a saw-tooth configuration and each segment of the copper trace has width of at least 1 mm, an ultra-high frequency (UHF) antenna separate from and spaced from the capacitive sensor, and a metal ground plane integrating the capacitive sensor with the UHF antenna, wherein surfaces of the ground plane define a first material empty area around the UHF antenna, the first material empty area being in the range of about 240 mm$^2$ to 280 mm$^2$, and wherein other surfaces of the ground plane define second and third material empty areas, each immediately adjacent to a side of the electrode that faces the UHF antenna, wherein each of the second and third material empty areas is generally rectangular and about 50 mm$^2$.

12. The device of claim 11, wherein the UHF antenna is cantilevered, with one end fixed to the ground plane and having a free end facing towards the electrode, the free end floating within the first material empty area.

13. The device of claim 11, wherein the first material empty area is generally rectangular and is defined by a cut-out in a side of the ground plane.

14. The device of claim 11, wherein the second material empty area defines a cut-out in one side of the ground plane and the third material empty area defines a cut-out in an opposing side of the ground plane.

15. The device of claim 10, wherein the capacitor sensor is constructed and arranged to detect proximity with, or contact with, a user's hand, and wherein the UHF antenna is constructed and arranged to detect frequencies in the range of 2.4 GHz to 2.48 GHz.

16. The device of claim 11, wherein the capacitive sensor and the UHF antenna are part of a door handle of a vehicle, the capacitor sensor being constructed and arranged to detect proximity with, or contact with, a user's hand, and wherein the UHF antenna is constructed and arranged to detect frequencies in the range of 2.4 GHz to 2.48 GHz.

* * * * *